US008552500B2

(12) United States Patent
Dennard et al.

(10) Patent No.: US 8,552,500 B2
(45) Date of Patent: Oct. 8, 2013

(54) STRUCTURE FOR CMOS ETSOI WITH MULTIPLE THRESHOLD VOLTAGES AND ACTIVE WELL BIAS CAPABILITY (75) Inventors: Robert H. Dennard, Cronton-on-Hudson, NY (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/114,283

(22) Filed: May 24, 2011

(65) Prior Publication Data
US 2012/0299080 A1    Nov. 29, 2012

(51) Int. Cl.
H01L 27/12    (2006.01)

(52) U.S. Cl.
USPC ............ 257/350; 257/349; 438/155; 438/164

(58) Field of Classification Search
USPC .............. 257/107, 139, 292, 296, 327, 347, 257/348, 350, 351, 365, 510, 627; 438/149, 438/155, 157, 164
See application file for complete search history.

(56) References Cited

U.S. PATENT DOCUMENTS

| 5,103,277 | A | 4/1992 | Caviglia et al. ............... 357/23.7 |
| 5,185,535 | A | 2/1993 | Farb et al. ..................... 257/351 |
| 5,610,083 | A | 3/1997 | Chan et al. ..................... 437/21 |
| 5,619,054 | A | 4/1997 | Hashimoto .................... 257/347 |
| 5,892,260 | A | 4/1999 | Okumura et al. |
| 6,010,926 | A | 1/2000 | Rho et al. |
| 6,121,821 | A | 9/2000 | Miki |
| 6,172,378 | B1 | 1/2001 | Hull et al. |
| 6,249,458 | B1 | 7/2001 | Shokouhi et al. |
| 6,661,042 | B2 | 12/2003 | Hsu .............................. 257/239 |
| 6,876,055 | B2 | 4/2005 | Iwata et al. |
| 6,972,478 | B1 * | 12/2005 | Waite et al. ................... 257/627 |
| 7,052,966 | B2 | 5/2006 | Kar-Roy et al. |
| 7,115,950 | B2 | 10/2006 | Tokushige |

(Continued)

FOREIGN PATENT DOCUMENTS

| JP | 07273184 | 10/1995 |
| JP | 2005159245 | 6/2005 |
| KR | 2006070025 | 6/2006 |
| WO | 2010082504 A1 | 7/2010 |

OTHER PUBLICATIONS

M. Khater, et al., "FDSOI CMOS with Dielectrically-Isolated Back Gates and 30mm $L_G$ High-$\downarrow$/Metal Gate", IEEE 2010, pp. 43-44.

(Continued)

Primary Examiner — Bradley K Smith
Assistant Examiner — Errol Fernandes
(74) Attorney, Agent, or Firm — Harrington & Smith (57) ABSTRACT A semiconductor substrate having a first type of conductivity and a top surface, a layer of oxide disposed over the top surface and a semiconductor layer disposed over the layer of oxide. A plurality of transistor devices are disposed upon the semiconductor layer. Each transistor device includes a channel between a source and a drain, where some transistor devices have a first type of channel conductivity and the remaining transistor devices have a second type of channel conductivity. A well region is formed adjacent to the top surface. The well region has a second type of conductivity. First trench isolation regions are between adjacent transistor devices that extend through the semiconductor layer. Second trench isolation regions are between adjacent transistor devices of opposite channel conductivity.

19 Claims, 9 Drawing Sheets

(56) References Cited

U.S. PATENT DOCUMENTS

| | | |
|---|---|---|
| 7,242,071 B1 | 7/2007 | Liu et al. |
| 7,358,573 B2 | 4/2008 | Cecchi et al. |
| 7,537,978 B2 | 5/2009 | Yagishita et al. ............. 438/149 |
| 7,570,509 B2 | 8/2009 | Takizawa ...................... 365/156 |
| 7,772,649 B2 | 8/2010 | Cheng et al. ................... 257/354 |
| 2003/0104658 A1 | 6/2003 | Furukawa et al. ............ 438/151 |
| 2007/0029620 A1 | 2/2007 | Nowak ........................... 257/369 |
| 2007/0241408 A1 | 10/2007 | Furukawa et al. |
| 2009/0160531 A1 | 6/2009 | Law et al. |
| 2010/0117122 A1 | 5/2010 | Benoit et al. |
| 2010/0173459 A1 | 7/2010 | Kerr et al. |
| 2010/0258872 A1* | 10/2010 | Sugii et al. .................... 257/350 |

OTHER PUBLICATIONS

Y. Shimamoto, et al., "Advantages of gate work-function engineering by incorporating sub-monolayer Hf at SiON/poly-Si interface in low-power CMOS", Symposium on VLSI Technology Digest of Technical Papers, 2005, pp. 132-133.

* cited by examiner

STRUCTURE FOR CMOS ETSOI WITH MULTIPLE THRESHOLD VOLTAGES AND ACTIVE WELL BIAS CAPABILITY

TECHNICAL FIELD

The exemplary embodiments of this invention relate generally to semiconductor devices and fabrication techniques and, more specifically, relate to the fabrication of semiconductor transistor devices, such as those used in static random access memory (SRAM) and associated logic circuitry, using an extremely thin silicon on insulator (ETSOI) substrate.

BACKGROUND

In silicon on insulator (SOI) technology a thin silicon layer is formed over an insulating layer, such as silicon oxide, which in turn is formed over a substrate. This insulating layer is often referred to as a buried oxide (BOX) layer or simply as a BOX. For a single BOX SOI wafer the thin silicon layer is divided into active regions by shallow trench isolation (STI) which intersects the BOX and provides a total isolation for active device regions formed in the silicon layer. Sources and drains of field effect transistors (FETs) are formed, for example, by ion implantation of n-type and/or p-type dopant material into the thin silicon layer with a channel region between the source and drain using the gate pattern to self-define the channel region. Prior to the formation of sources and drains, gates are formed on top of the channel region, for example, by deposition of a gate dielectric and conductor on the top surface of the thin silicon, followed by photolithographic patterning and etching. So-called back gates can also be formed under the active region on a single BOX SOI wafer using the BOX layer as the back gate dielectric. The back gates can be defined by either p-type or n-type doping.

Transistors having back gates typically use relatively thin silicon and BOX layers to enable fully depleted device operation with a threshold voltage which is responsive to the back gate. Such FETs built in thin SOI technology with back gates have significant advantages such as, for example, reduced short channel effects, less threshold variability due to body doping fluctuations, and an ability to use the back gate voltage to adjust the threshold.

ETSOI transistors can be considered as thin-channel planar devices. Halo implantation is used to control electrostatics in conventional transistors. Although the halo implant controls short channel effects, it also causes large random doping fluctuations and increases junction leakage and gate-induced drain leakage (GIDL), which are critical to low power platforms. Electrostatics for ETSOI devices, on the other hand, are controlled by the thin SOI channel, and not by the use of halo implants.

SUMMARY

In accordance with the exemplary embodiments of this invention there is provided a structure that comprises a semiconductor substrate having a first type of conductivity and a top surface; an insulating layer disposed over the top surface; a semiconductor layer disposed over the insulating layer and a plurality of transistor devices disposed upon the semiconductor layer. Each transistor device comprises a source, a drain and a gate stack defining a channel between the source and the drain, where some transistor devices have a first type of channel conductivity and the remaining transistor devices have a second type of channel conductivity. The structure further comprises a well region formed adjacent to the top surface of the substrate and underlying the plurality of transistor devices, the well region having a second type of conductivity and extending to a first depth within the substrate. The structure further comprises first isolation regions between adjacent transistor devices and extending through the semiconductor layer to a depth sufficient for electrically isolating the adjacent transistor devices from one another, and second isolation regions between selected adjacent transistor devices. The second isolation regions extend through the silicon layer, through the insulating layer and into the substrate to a second depth that is greater than the first depth to electrically separate the well region into a first well region and a second well region.

The second isolation regions can be formed between transistors of opposite channel conductivity and/or between transistors having the same channel conductivity but for which different back gate or well biases are desired.

Further in accordance with the exemplary embodiments of this invention there is provided a method to fabricate a structure. The method comprises providing a wafer comprising a semiconductor substrate having a first type of conductivity and a top surface, an insulating layer disposed over the top surface and a semiconductor layer disposed over the insulating layer. The method further comprises implanting through the semiconductor layer and the insulating layer a well region to be adjacent to the top surface of the substrate, the well region having a second type of conductivity and a well depth within the substrate. The method further includes forming first isolation regions at locations predetermined to be between a pair of subsequently formed adjacent transistor devices. The first isolation regions are formed to have a first depth that extends through the semiconductor layer to a depth sufficient to electrically isolate the adjacent transistor devices from one another. The method further includes forming second isolation regions at locations predetermined to be between a pair of subsequently formed selected adjacent transistor devices, the second isolation regions are formed to have a second depth that extends through the silicon layer, through the insulating layer and into the substrate, where the second depth is greater than the well depth to electrically separate the well region into a first well region and a second well region. The method further comprises forming the transistor devices over the semiconductor layer.

The second isolation regions can be formed between adjacent transistors that have an opposite type of conductivity relative to each other, and/or between transistors of the same type of conductivity but for which a different back gate bias is desired.

DETAILED DESCRIPTION

In general, it can be advantageous to use a different back gate doping type (p-type or n-type) to achieve a desired transistor threshold voltage. Basically two different doping types are used to achieve two different threshold voltages. Changing the back gate type from n-type to p-type results in a change of the work function of approximately one volt, and is electrically equivalent to changing the applied potential by that amount. The use of the different back gate doping can be simpler to implement than modifying the work function of the top gate, and can reduce the number of required masks. In addition, different back gates can be used for other functions.

It can also be advantageous to apply different back gate biases to nfets and pfets so as to tune performance, compensate for process variations and to optimize for given front gate work functions.

It can also be advantageous to apply the same back gate bias to all nfets and the same back gate bias to all pfets in a block of logic circuits so that logic blocks of different thresholds may be interchanged without disruption.

It can also be advantageous to have low leakage amongst and between wells, to reduce the number of contacts to the wells and to closely space devices in different wells.

With regard to how the invention described herein improves over the prior art, current design and fabrication techniques may permit achieving the presence of the abovementioned different back gate doping types, and the different back gate biases, but not simultaneously. Additionally, current techniques have difficulty in achieving the other advantages noted above in a simultaneous manner.

The use of the exemplary embodiments of this invention provides in one aspect thereof a triple well back gate structure and dual-depth insulating isolation (STI) characterized by relatively shallow intra-well STI and deeper inter-well STI. The deeper inter-well STI electrically isolates differently biased wells from one another. The use of the exemplary embodiments of this invention thus provides in another aspect thereof independent nfet and pfet (and other region) biasing, with small inter-device spacing and low leakage, as adjacent wells are separated by the insulator material of the deep inter-well STI. The use of the exemplary embodiments of this invention provides in yet another aspect thereof an ability for the back gate to switch threshold voltages, independently of the potential applied.

The embodiments of this invention provide deep insulating isolation between nfets and pfets (or between transistors of the same type of conductivity but for which a different back gate bias is desired), and also provide shallow isolation between FETs of the same type. The "deep" insulating region is sufficiently deep to completely isolate the wells from one another, while the "shallow" isolation allows for conductivity within the well while isolating adjacent devices that are disposed over the well from one another. Different biases can be applied to different wells (well regions). As a non-limiting example using a p-type substrate with n-type wells, the well biases are made more positive than the bias of the underlying common p-type substrate (or at least not substantially forward-biased). The applied biases may be static or dynamic (time varying). In a given well the n-type material underlying a particular transistor is biased to a desired potential via a well contact and functions as an n-type back gate region for that particular transistor.

Exemplary embodiments of this invention also provide p-type back gate regions selectively beneath certain FETs disposed over an n-well region. These p-type back gate regions are electrically floating and are embedded in the n-well material and serve to modulate the threshold voltage (Vt) of the overlying FET. The electrically floating p-type back gate regions are at the same potential as n-type back gate regions within the same n-well due to capacitive coupling and leakage between the p-type back gate region and the surrounding n-well region in which the p-type back gate region is embedded, where a diode junction is formed between the electrically floating p-type back gate region and the adjacent n-type well. The p-type back gate regions are isolated from the common p-substrate by the intervening portion of the material of the n-well, which is deeper (thicker) than the p-type back gate region.

The specific well bias potentials that are used can be tailored to the front (top) gate work functions. The examples discussed below are fully consistent with known types of metal gate materials in a gate-first sequence, although replacement gate embodiments are also within the scope of the invention. The precise values of the bias potentials used depends at least in part on the transistor device design point.

It should be noted that all the well types may be reversed if desired (p-type wells for n-type wells) by also reversing the doping type of the substrate. That is, the exemplary embodiments of this invention should not be construed as being limited for use with wells having only one type of conductivity (e.g., only used with n-type wells over a p-type substrate).

Figure 1:
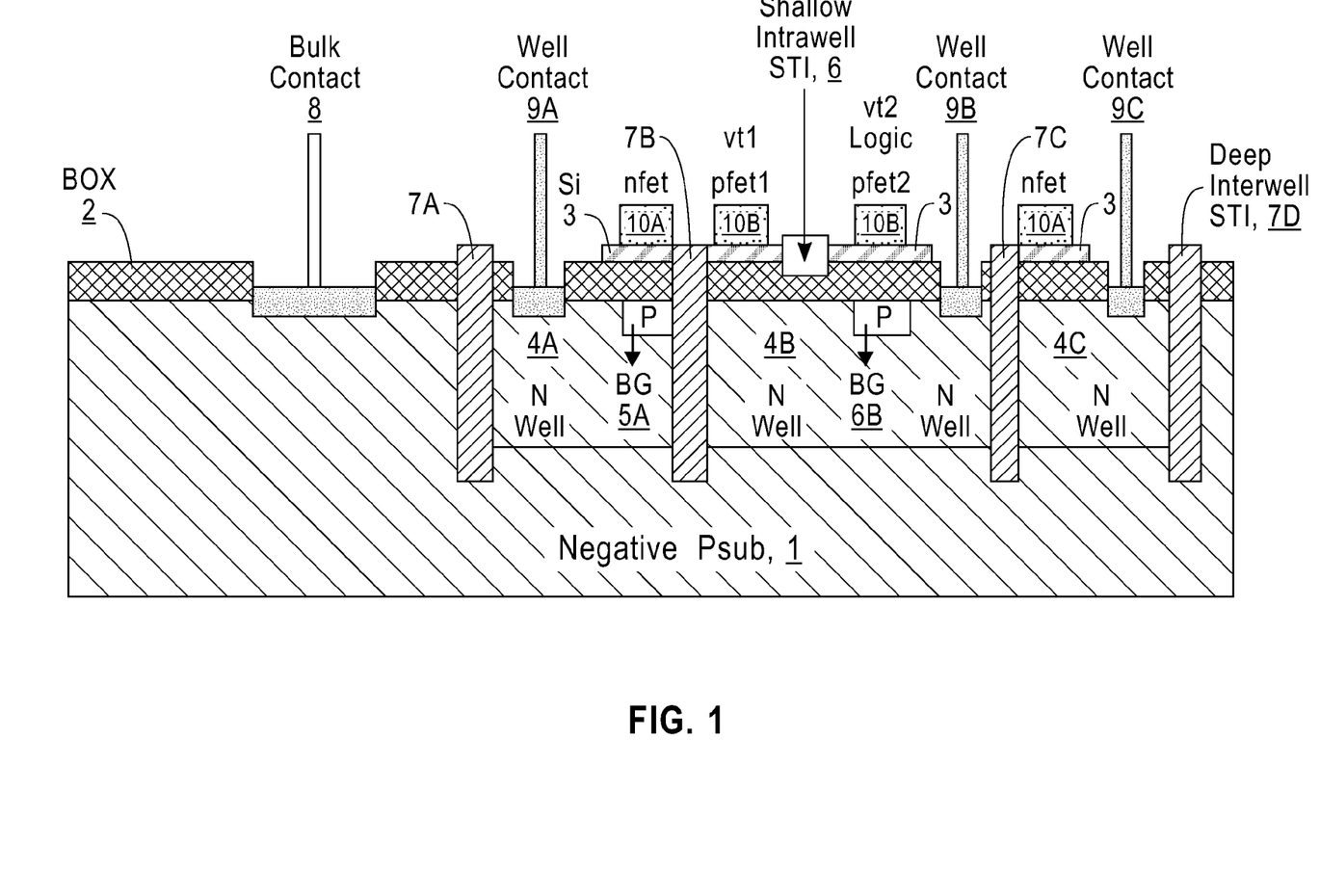
FIG. 1 is a cross-sectional enlarged view (not to scale) of a portion of an ETSOI wafer that includes n-wells and p-type back gates with shallow intra-well STI that provides electrical isolation between adjacent FETS of the same well, and deep inter-well STI that extend completely through the n-well regions and sufficiently deep into the substrate so as to electrically isolate the n-well regions from one another along nfet/pfet boundaries and also boundaries between like devices with different desired bias voltages.

FIG. 1 is a cross-sectional enlarged view of a portion of wafer that includes a p-type substrate 1 (e.g., doping concentration $2 \times 10^{15}/cm^3$), a BOX layer 2 (e.g., 10-50 nm thick) and a thin Si layer 3 (e.g., generally less than about 10 nm in thickness, such as about 5-6 nm in thickness). Silicon layers of this thickness can be considered as being "extremely thin", and thus the overall structure may be characterized as being an ETSOI structure. The BOX layer 2 may be referred to simply as an insulating layer, as in some embodiments it can comprise composite layers including, for example, materials having a selected dielectric constant.

In FIG. 1 the Si layer 3 is depicted as being selectively retained only where desired, such as where FETS are to be located including nfets 10A and first and second pfets 10B. The FETS 10 are disposed over n-well regions 4A, 4B and 4C each of which in this example is separately biased by a well electrical contact 9A, 9B and 9C, respectively. A separate contact 8 is provided for supplying a bias potential to the p-type substrate 1. In this non-limiting example the n-well region 4C does not contain a p-type back gate (BG) 5 and the n-well region underlying the nfet 10A, biased via well contact 9C, functions as an n-type back gate for the overlying nfet. Also in this non-limiting example the n-well region 4A does not contain an n-type back gate and instead contains only the p-type back gate 5A underlying the nfet 10A. This floating p-type back is biased by leakage and capacitive coupling to the same potential as the n-well 4A in which it is embedded, where the n-well 4A is biased via well contact 9A. Also in this non-limiting example the n-well region 4B contains both an n-type back gate underlying pfet1 and a p-type back gate 5B underlying pfet2. During operation the presence of the p-type back gate 5B will cause the threshold voltage (Vt2) of the corresponding pfet2 10B to differ from the threshold voltage (Vt1) of pfet1 10B, which is disposed over the n-type back gate. For example, the pfet1 may have 1 nA off current (high threshold voltage device) while the pfet2 may have 10 nA off current (low threshold voltage device). The pfet1 and the pfet2 share the common n-well 4B, and are electrically separated from one another by a region of shallow intra-well STI 6 that cuts the intervening Si layer 3 and extends sufficiently deep into the underlying BOX 2 to provide electrical isolation between pfet1 and pfet2.

In accordance with an aspect of this invention there are also provided various deep inter-well STI 7 that extend completely through the n-well regions 4 and sufficiently deep into the p-type substrate 1 so as to electrically isolate the n-well regions 4 from one another along nfet/pfet boundaries. Note for example that deep STI 7B electrically isolates n-well 4A from n-well 4B, and that deep STI 7C electrically isolates n-well 4B from n-well 4C. As a non-limiting example, each of the inter-well STI 7 have a depth of about 200 nm. The width of the deep inter-well STI 7 may be in the range of about 25 nm to about 200 nm, with 50 nm being a nominal value. This arrangement beneficially permits the n-wells 4 to be independently biased via their respective well contacts 9. The range of bias voltage which may be applied to the wells is limited by considerations of leakage between adjacent wells and to the underlying substrate, and the convenience of generating and distributing the potentials. For a typical nominal power supply voltage of one volt, as a non-limiting example the p-type substrate may be biased at about −1 volts (or floating), the n-wells 4A and 4C underlying the nfets 10A may be biased in a range of about −1 volt to about 1 volt, and the n-well 4B underling the pfets 10B may be biased in a range of about 0 volt to about +2 volts. In this example the total well-to-substrate and well-well bias is a maximum of three volts, for which the leakage is not excessive. In some circumstances (e.g., depending on the work functions of the top gates) it might be advantageous to shift the potentials in the above example higher or lower. For example, the substrate might be biased at −2V and the wells potentials varied from −2V to +1, or the substrate could be biased at 0V and the wells varied from 0V to +3 volts. In practice, the n-wells 4 are biased so as ensure they are reversed biased with respect to the p-substrate 1. A suitable n-type dopant is arsenic, and a suitable p-type dopant for the back gates 5 is boron. The deep STI 7 can also be placed between transistors 10 of the same channel conductivity but for which different back gate biases are desired.

Note again that the n-well bias applied through contacts 9 can be static, or it can be dynamic and changed at, e.g., nanosecond time intervals to provide active control of FET Vt. That is, in some embodiments the n-well bias can be a time varying potential.

Figure 2:
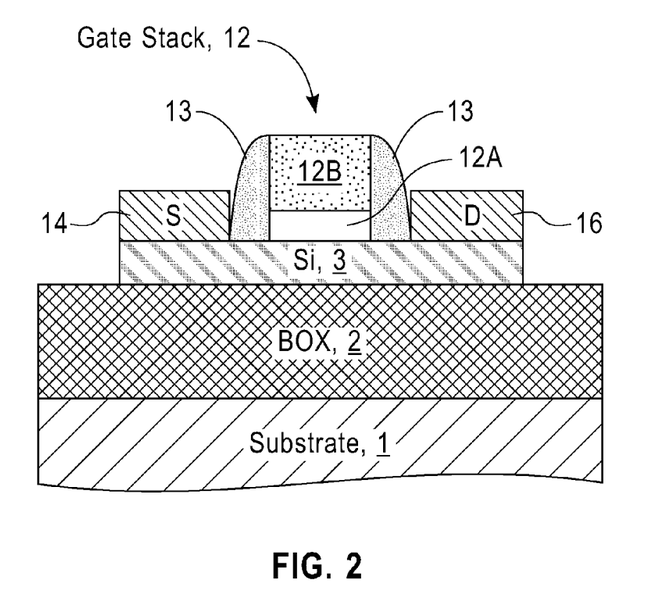
FIG. 2 shows in greater detail one of the FETS of FIG. 1 in cross-section (not to scale).

In FIG. 1 the FETS 10 are depicted as simple blocks. FIG. 2 shows one of the FETS 10 in cross-section (not to scale) in greater detail. Each FET 10 includes a gate stack 12, a source (S) 14 and a drain (D) 16. Assuming an ETSOI compatible gate-first fabrication process the gate stack 12 is deposited first, and the source 14 and drain 16 are subsequently formed by an epitaxial Si growth process. In forming the gate stack on the Si layer 3 there are deposited and defined in sequence, in the illustrated non-limiting example, a dielectric layer 12A, a conductive gate layer 12B, and a dielectric spacer layer 13. As was noted above, while the sequence described herein is a gate-first sequence, the use of a replacement gate process is also compatible with the embodiments of this invention. Different gate stacks may be used with different materials to give different work functions, for example for nFET s 10A and pFets 10B. A different dielectric may also be used to create thick oxide transistors for higher voltage applications and these devices can exhibit work functions that differ substantially from those of the FETS 10A and 10B.

In FIG. 1 there could also be present thick-oxide devices disposed over an associated electrically isolated (by the deep inter-well STI 7) n-well biased at, for example, 0V or 1 V or 2V, as desired and appropriate to the device front gate work function and the desired threshold voltage.

Figure 3A:
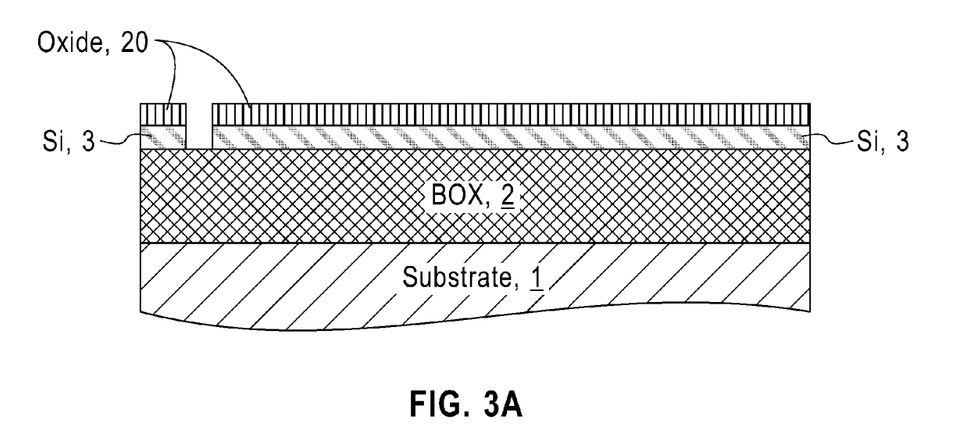
FIGS. 3A-3H show an example of an integrated back gate doping and dual STI process flow.
Figure 3B:
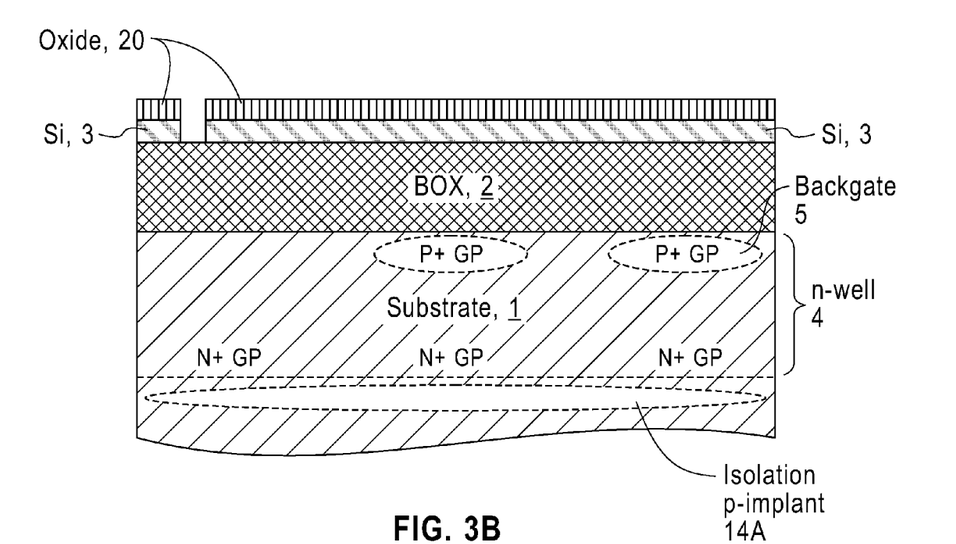
Figure 3C:
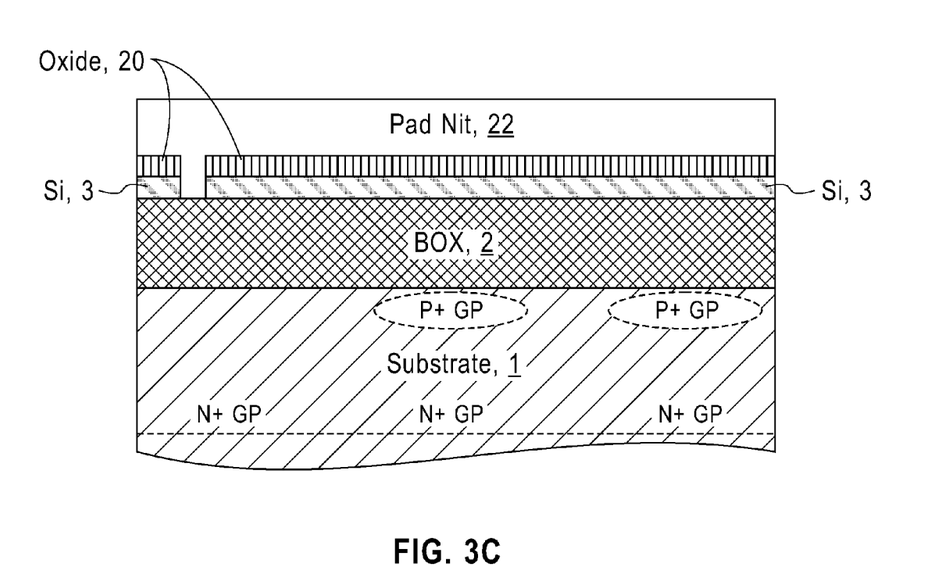
Figure 3D:
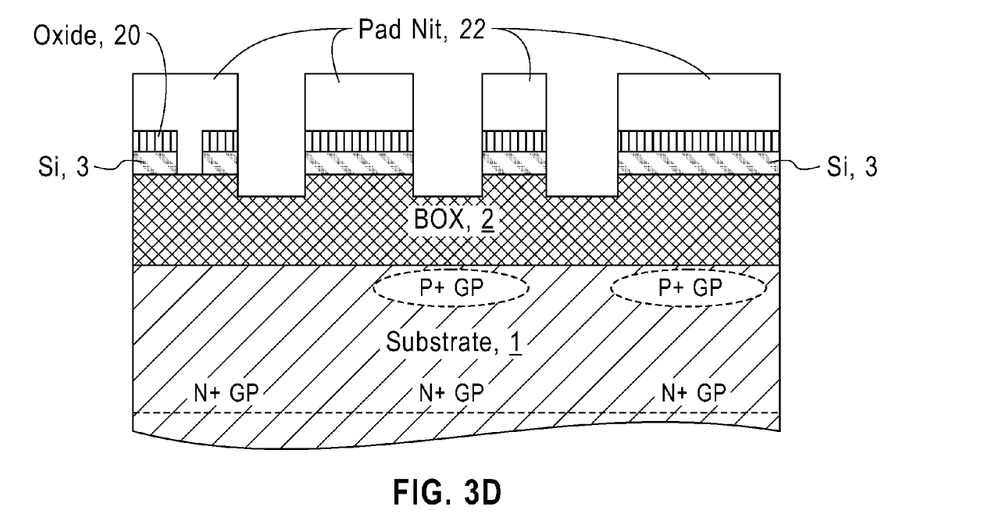
Figure 3E:
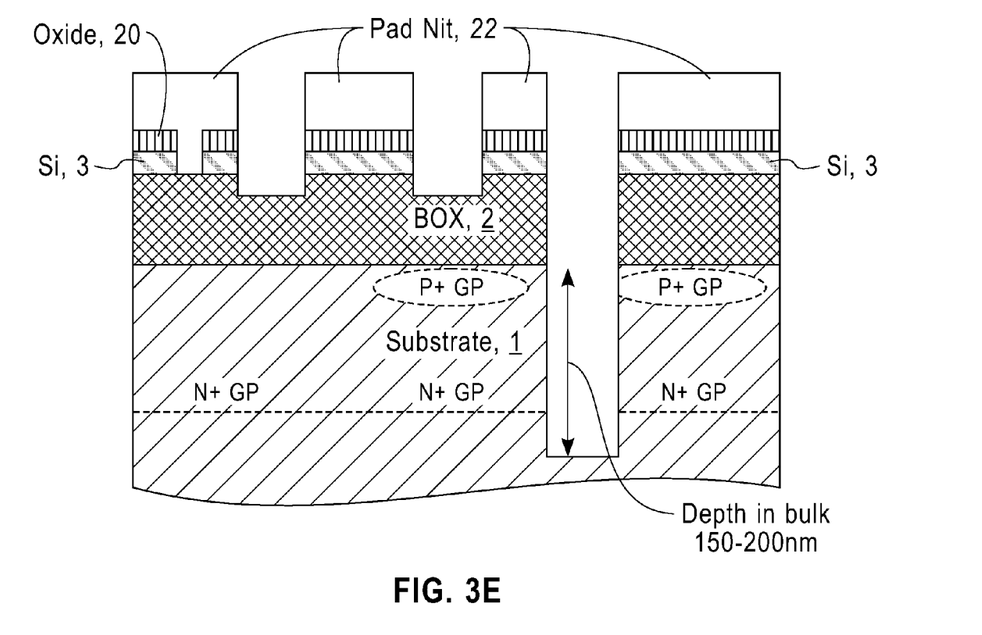
Figure 3F:
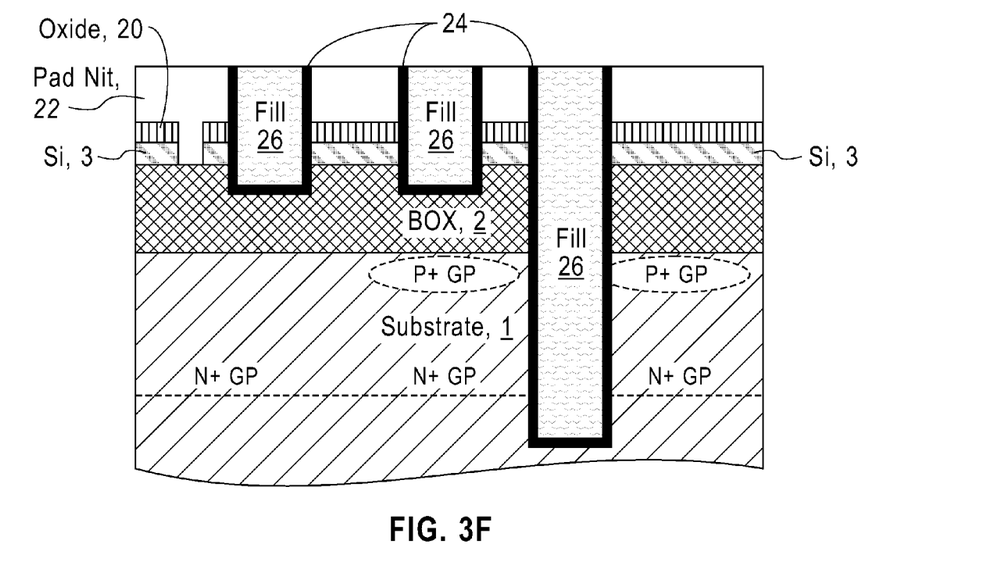
Figure 3G:
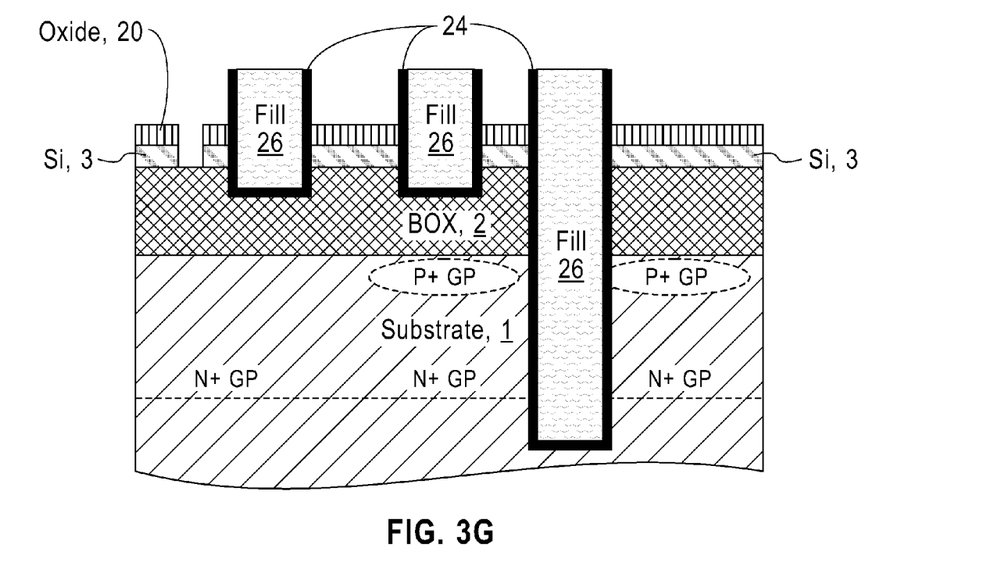
Figure 3H:
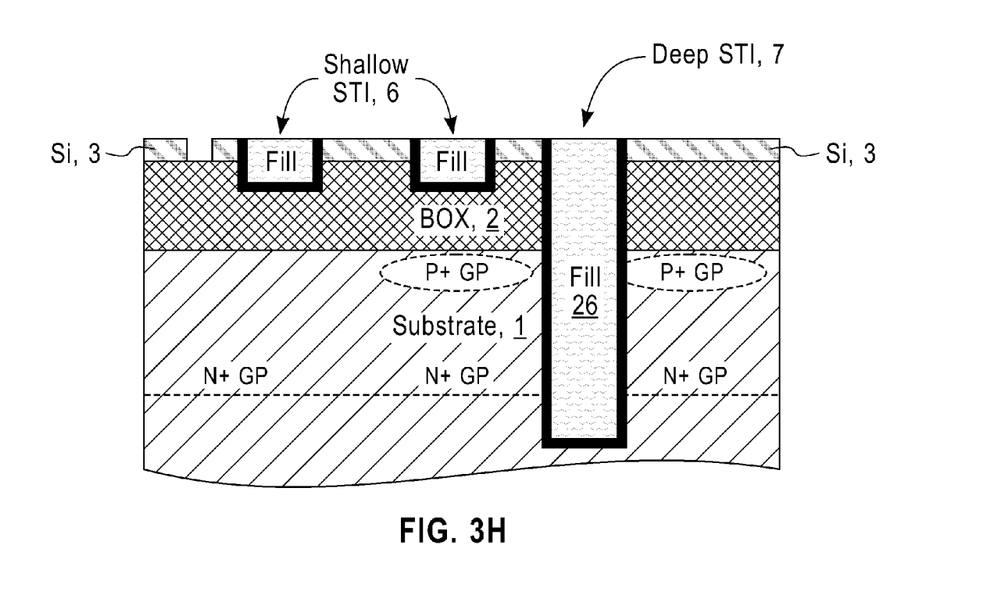

Reference is now made to FIGS. 3A-3H for showing an example of an integrated back gate doping and dual STI process flow further in accordance with the exemplary embodiments of this invention. In FIG. 3A the starting ETSOI wafer has a layer of (sacrificial) oxide 20 deposited followed by patterning to define the locations of the n-well regions 4. In FIG. 3B an n-type arsenic implant is performed (e.g., 300 kV, dose $4 \times e^{13}$) to form the n-well region 4. At the same time a deep boron implant (e.g. 80 KeV, dose $2e^{13}$) for well-well isolation 14a may be performed, followed by additional patterning to perform a compensating p-type boron implant (e.g., 10 kV, dose $4 \times e^{13}$) to form the p-type back gates 5. Although not shown, the isolation implant 14A is present in FIGS. 3C-3H as well. The patterning is such as to form the p-type back gates 5 where desired within the upper portion of the n-well region 4 n-type implant. FIG. 3C shows the deposition of a nitride layer 22. FIG. 3D shows a result of patterning of the nitride layer 22 to define the shallow trench (intra-well) locations followed by etching. The shallow trench etch extends through the silicon layer 3 and partially into the BOX 2 and is formed at predetermined locations to correspond to the subsequently formed transistor devices having the same type of conductivity (between an adjacent pfet and pfet, or nfet and nfet)). Note in FIG. 3D that the right-most trench is actually a precursor for a deep trench (inter-well STI trench) formed in FIG. 3E. FIG. 3E shows a result of patterning to define the deep trench (inter-well) locations followed by etching. The deep trench etch extends through the silicon layer 3, through the BOX 2 and some distance (e.g., 150-200 nm) into the Si 1. The depth of the deep trench etch is such that it extends beyond (deeper into the substrate 1) than the deepest extent of n-type implant (FIG. 3B) that formed the n-well region 4. The deep trenches are formed at predetermined locations to correspond to the subsequently formed transistor devices having the opposite type of conductivity (between an adjacent pfet and nfet). The deep trenches can also be formed between subsequently formed transistor devices of the same channel conductivity but for which different back gate biases are desired. FIG. 3F shows a result of a single fill and polish operation. The fill material 26 may be any conventional fill material such as an oxide. An optional trench liner 24 may also be used. FIG. 3G shows a result of a pad stripping operation where the nitride layer deposited in FIG. 3C is removed. FIG. 3H shows a result of a fill etch-down process and the stripping of the sacrificial oxide layer 20 that was deposited in FIG. 3A. Processing of the ETSOI wafer then proceeds to fabricate the various FETS 10 and contacts 9 so as to form the desired integrated circuit.

Figure 4:
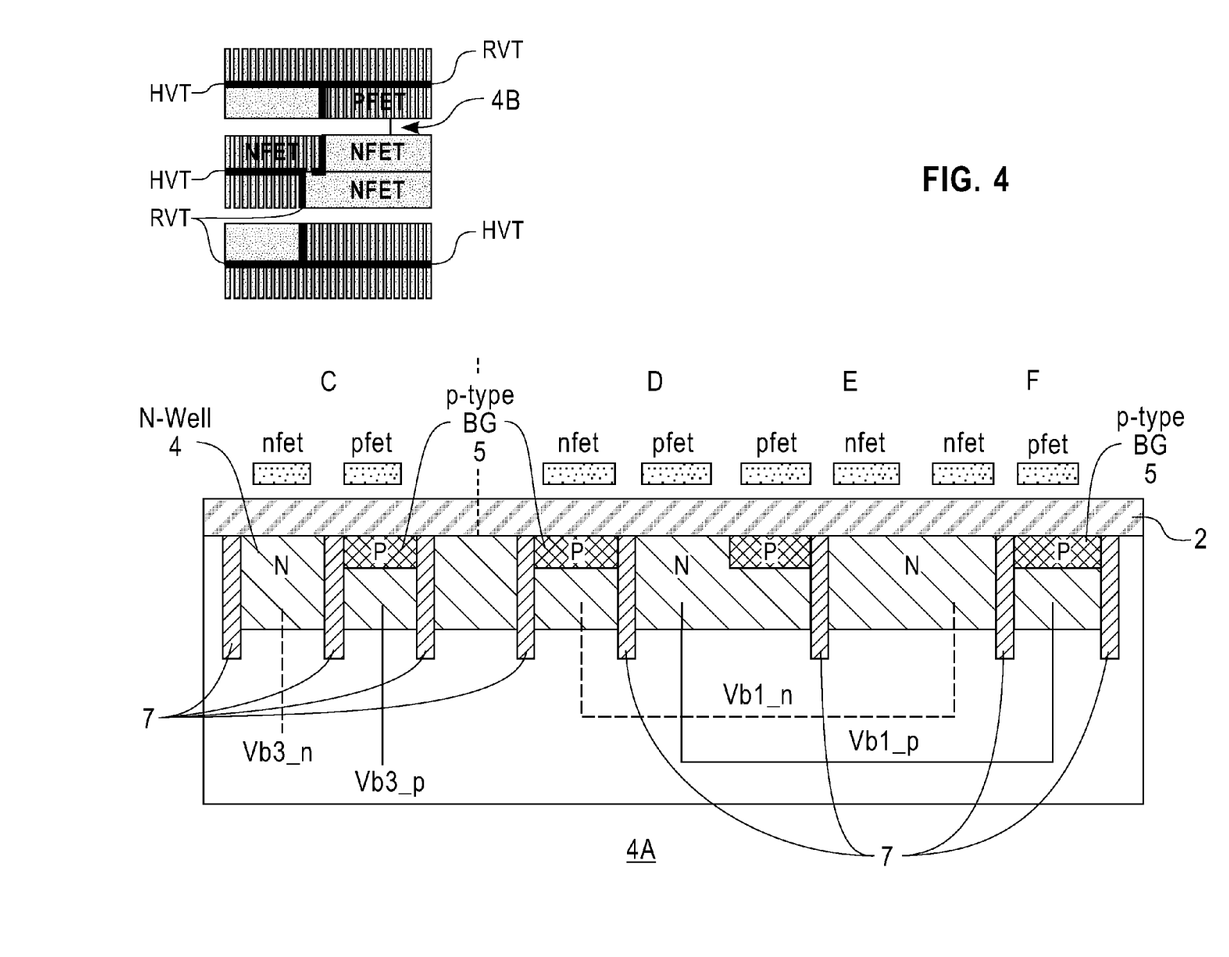
FIG. 4 shows a cross-sectional view (4A) of an exemplary arrangement of FETS constructed in accordance with the embodiments of this invention and a top view (4B) of an exemplary arrangement of FETS constructed in accordance with the embodiments of this invention.

FIG. 4 shows a cross-sectional view (4A) of an exemplary arrangement of FETS constructed in accordance with the embodiments of this invention and a top view (4B) of an exemplary arrangement of FETS 10 constructed in accordance with the embodiments of this invention. In this example there are three FET pairs (D, E, F) in one domain and one FET pair C in a second domain. The back gate biases are set nominally as required by the pfet and nfet work functions and/or as desired for the threshold voltages. The nfets D, E and F all share the same bias (Vb1_n) and can be adjacent, while the nfet device C has a different bias (Vb3_n) and is separated from devices D, E and F. The pfets D, E and F all share the same bias (Vb1_p) and can be adjacent, while the pfet device C has a different bias (Vb3_p) and is separated from devices D, E and F. Note the deep inter-well STI 7 that separates the pfets from the adjacent nfets. Note as well the groupings of the nfets and the pfets in FIG. 4B, and the presence of both higher threshold voltage transistors (HVT) and regular (lower) threshold voltage transistors (RVT).

Figure 5:
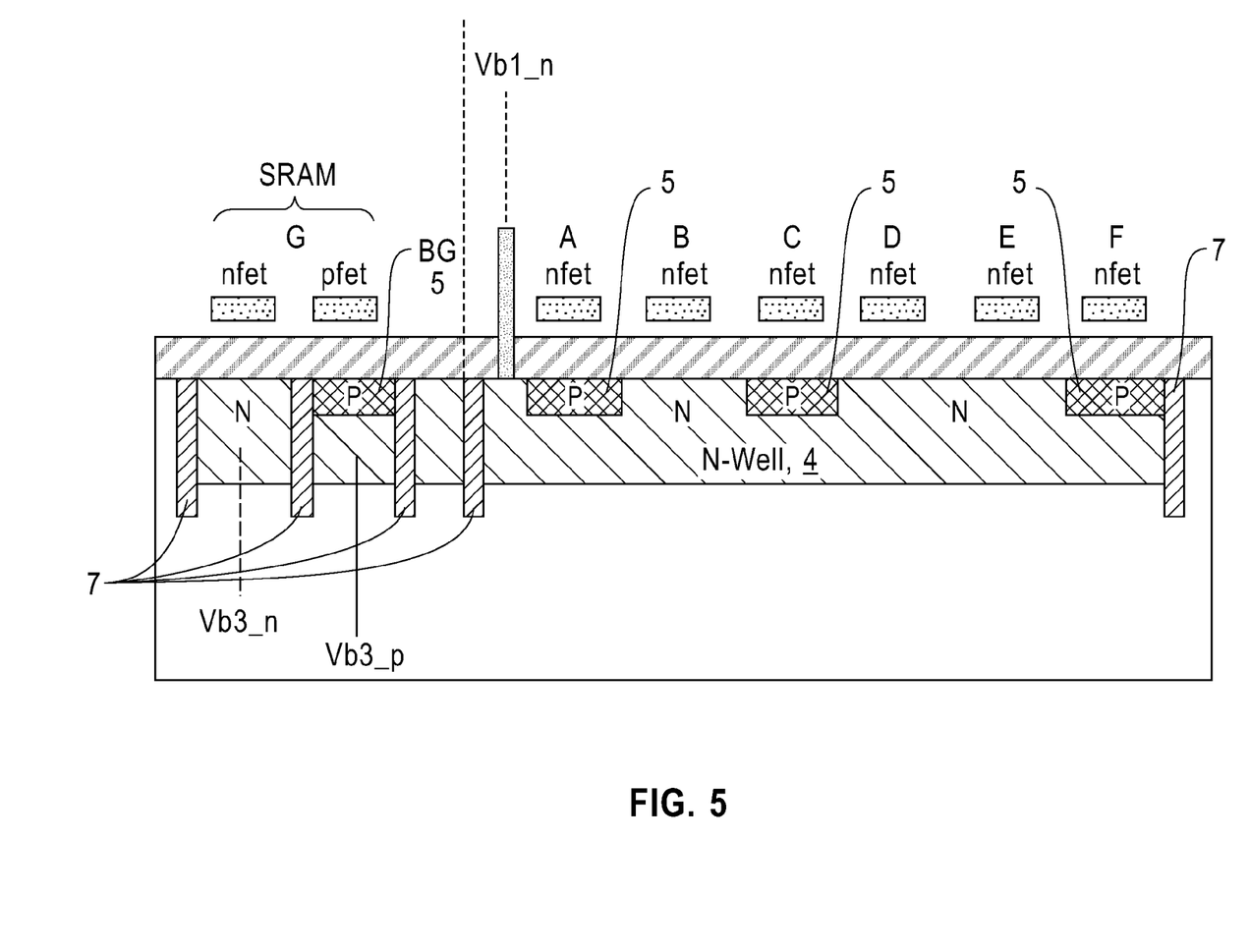
FIG. 5 shows a cross-sectional view of an exemplary arrangement of FETS 10 that are also constructed in accordance with the embodiments of this invention.

FIG. 5 shows a cross-sectional view of an exemplary arrangement of FETS 10 that are also constructed in accordance with the embodiments of this invention. In this example there are six FETs (A-F) in one domain and one FET pair G in a second domain (in a direction perpendicular to the direction of FETs A-F). The FET pair G may constitute a static RAM (SRAM) cell. In this example the six FETs A-F are all nfets and share a common n-well 4 that is biased with Vb1. In this example three of the nfets (A, C, F) in the common n-well have associated p-type back gates 5, and the other three nfets (B, D, E) have an associated back gate n-well 4. As there are no pfets in this non-limiting arrangement the deep STI 7 is placed only at the boundaries of the n-well 4. The FET pair G is composed of an nfet and a pfet which are thus separated by an intervening deep inter-well STI 7. The FET pair G is biased with separate biases Vb3_n and Vb3_p.

As can be appreciated the structure described above with reference to FIGS. 1-5 can be characterized at least in part as comprising triple well transistor devices, where for certain ones of the FETS 10 the underlying back gate 5 is a first well, the n-well region 4 is a second well, and the underlying substrate 1 and the isolation implant 14A is a third well.

It should be realized that the exemplary embodiments can be used without specifically incorporating the p-type back gate regions 5. The resultant structure, for example with n wells and n-type back gates only, can be very useful in low power applications to provide independently controlled n and p thresholds, where different values within the same chip can be obtained, if needed, by connecting n-well 4 of those transistors 10 to different voltages.

In general and as was discussed above the biasing of the p-type back gates 5, and their resulting potentials, is controlled by the voltages applied to their respective well contacts 9. As was discussed above, capacitive coupling and leakage between the back gate 5 and the surrounding well region 4, in which the back gate 5 is embedded, functions to bias the back gate 5. The back gate 5 can be considered to be floating within the well region 4 in which it is embedded and to be biased via leakage and capacitive coupling by the potential applied to the well region 4.

Figure 6:
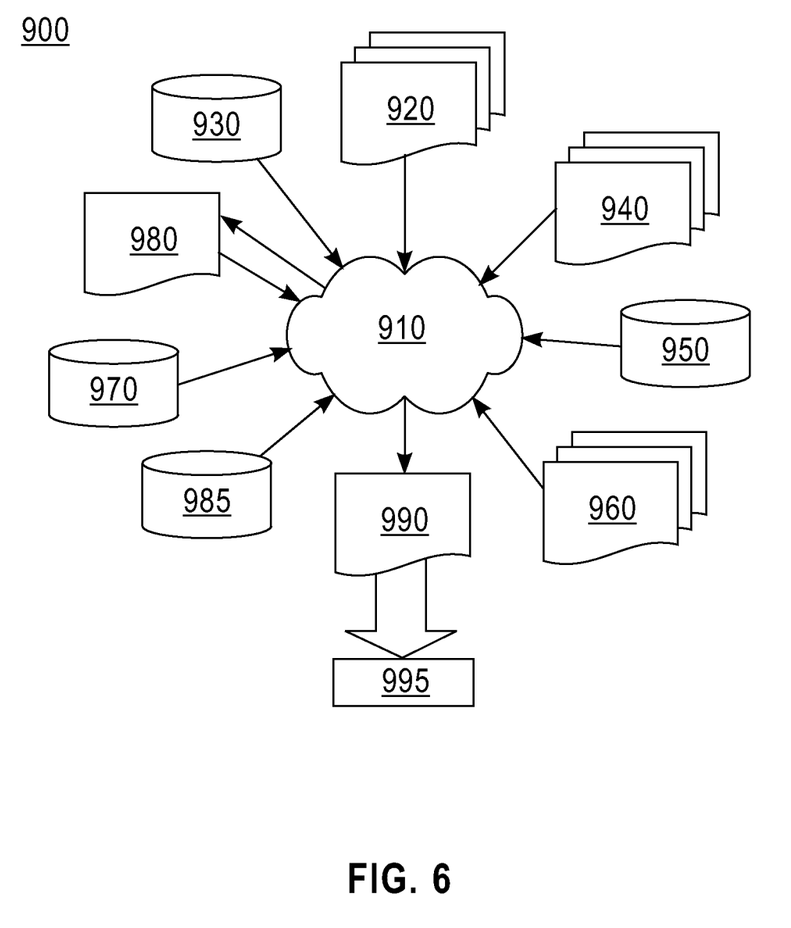
FIG. 6 shows a block diagram of an exemplary design flow used for example, in semiconductor IC logic design, simulation, test, layout, and manufacture.

FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera 7 Inc. or Xilinx 7 Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer.

When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is re-synthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A structure, comprising:
    a semiconductor substrate having a first type of conductivity and a top surface;
    an insulating layer disposed over the top surface;
    a semiconductor layer disposed over the insulating layer;
    a plurality of transistor devices disposed upon the semiconductor layer, each transistor device comprising a source, a drain and a gate stack defining a channel between the source and the drain, where some transistor devices have a first type of channel conductivity and the remaining transistor devices have a second type of channel conductivity;
    a well region formed adjacent to the top surface of the substrate and underlying the plurality of transistor devices, the well region having a second type of conductivity and extending to a first depth within the substrate;
    first isolation regions between adjacent transistor devices and extending through the semiconductor layer to a depth sufficient for electrically isolating the adjacent transistor devices from one another; and second isolation regions between selected adjacent transistor devices, the second isolation regions extending through the semiconductor layer, through the insulating layer and into the substrate to a second depth that is greater than the first depth to electrically separate the well region into a first well region and a second well region;

further comprising a first contact connected to the first well region for electrically connecting the first well region to a first bias potential and a second contact connected to the second well region for electrically connecting the second well region to a second bias potential.

2. The structure of claim 1, further comprising at least one back gate region disposed wholly within a well region and underlying one of the plurality of transistor devices, the at least one back gate region having the first type of conductivity and being electrically floating within the well region, where during operation the at least one back gate region having the first type of conductivity is biased by leakage and capacitive coupling by a bias potential applied to the well region within which it is disposed.

3. The structure of claim 1, where at least one of the first bias potential and the second bias potential is a time varying potential to dynamically change a threshold voltage of at least one overlying transistor.

4. The structure of claim 1, where the first well region and the second well region are each biased so as to be reversed biased with respect to the semiconductor substrate.

5. The structure of claim 4, further comprising a third contact connected to the semiconductor substrate for electrically biasing the semiconductor substrate.

6. The structure of claim 1, where a bias potential is selected in part based on a work function associated with an overlying gate structure.

7. The structure of claim 1, where a bias potential is selected in part to establish a threshold voltage of an overlying transistor device at a desired point.

8. The structure of claim 1, where the first type of conductivity is p-type and the second type of conductivity is n-type, or where the first type of conductivity is n-type and the second type of conductivity is p-type.

9. The structure of claim 1, where the semiconductor layer disposed over the insulating layer is a silicon layer having a thickness of about 10 nm or less.

10. The structure of claim 1, further comprising at least one second isolation region between adjacent transistor devices of opposite channel conductivity.

11. The structure of claim 1, further comprising at least one second isolation region between adjacent transistor devices of the same channel conductivity but for which different back gate biases are used.

12. A structure, comprising:
a semiconductor substrate having a first type of conductivity and a top surface;
an insulating layer disposed over the top surface;
a semiconductor layer disposed over the insulating layer;
a plurality of transistor devices disposed upon the semiconductor layer, each transistor device comprising a source, a drain and a gate stack defining a channel between the source and the drain, where some transistor devices have a first type of channel conductivity and the remaining transistor devices have a second type of channel conductivity;
a well region formed adjacent to the top surface of the substrate and underlying the plurality of transistor devices, the well region having a second type of conductivity and extending to a first depth within the substrate;
first isolation regions between adjacent transistor devices and extending through the semiconductor layer to a depth sufficient for electrically isolating the adjacent transistor devices from one another; and
second isolation regions between selected adjacent transistor devices, the second isolation regions extending through the semiconductor layer, through the insulating layer and into the substrate to a second depth that is greater than the first depth to electrically separate the well region into a first well region and a second well region;
said structure further comprising triple well transistor devices where certain transistor devices comprise first, second and third well regions disposed at least partially one above another.

13. A structure, comprising:
a semiconductor substrate having a first type of conductivity and a top surface;
an insulating layer disposed over the top surface;
a semiconductor layer disposed over the insulating layer;
a plurality of transistor devices disposed upon the semiconductor layer, each transistor device comprising a source, a drain and a gate stack defining a channel between the source and the drain, where some transistor devices have a first type of channel conductivity and the remaining transistor devices have a second type of channel conductivity;
a well region formed adjacent to the top surface of the substrate and underlying the plurality of transistor devices, the well region having a second type of conductivity and extending to a first depth within the substrate;
first isolation regions between adjacent transistor devices and extending through the semiconductor layer to a depth sufficient for electrically isolating the adjacent transistor devices from one another;
second isolation regions between selected adjacent transistor devices, the second isolation regions extending through the semiconductor layer, through the insulating layer and into the substrate to a second depth that is greater than the first depth to electrically separate the well region into a first well region and a second well region; and
at least one back gate region disposed wholly within a we region and underlying one of the plurality of transistor devices, the at least one back gate region having the first type of conductivity and being electrically floating within the well region, where during operation the at least one back gate region having the first type of conductivity is biased by leakage and capacitive coupling by a bias potential applied to the well region within which it is disposed.

14. The structure of claim 13, further comprising a first contact connected to the first well region for electrically biasing the first well region with a first bias potential and a second contact connected to the second well region for electrically biasing the second well region with a second bias potential, and further comprising a third contact connected to the semiconductor substrate for electrically biasing the semiconductor substrate.

15. The structure of claim 13, where the first type of conductivity is p-type and the second type of conductivity is n-type, or where the first type of conductivity is n-type and the second type of conductivity is p-type.

16. The structure of claim 13, where the semiconductor layer disposed over the insulating layer is a silicon layer having a thickness of about 10 nm or less.

17. The structure of claim 13, characterized at least in part as comprising triple well transistor devices where certain transistor devices comprise first, second and third well regions disposed at least partially one above another.

18. The structure of claim 13, further comprising at least one second isolation region between adjacent transistor devices of opposite channel conductivity.

19. The structure of claim 13, further comprising at least one second isolation region between adjacent transistor devices of the same channel conductivity but for which different back gate biases or used.

* * * * *